United States Patent [19]

Grunwald et al.

[11] Patent Number: 4,701,390

[45] Date of Patent: Oct. 20, 1987

[54] THERMALLY STABILIZED PHOTORESIST IMAGES

[75] Inventors: John J. Grunwald, New Haven; Allen C. Spencer, Naugatuck, both of Conn.

[73] Assignee: MacDermid, Incorporated, Waterbury, Conn.

[21] Appl. No.: 802,514

[22] Filed: Nov. 27, 1985

[51] Int. Cl.$^4$ .............................................. G03C 5/00
[52] U.S. Cl. .................................. 430/325; 430/324; 430/326; 430/330
[58] Field of Search ............... 430/325, 326, 328, 330, 430/331, 324

[56] References Cited

U.S. PATENT DOCUMENTS

| | | |
|---|---|---|
| 3,652,274 | 3/1972 | Vetelst et al. |
| 3,859,098 | 1/1975 | Iwama et al. ........................ 430/281 |
| 4,125,650 | 11/1978 | Chiu et al. ........................... 427/337 |
| 4,187,331 | 2/1980 | Ma ........................................ 430/328 |
| 4,259,369 | 3/1981 | Canavello et al. .................. 427/155 |
| 4,454,222 | 6/1984 | Tada et al. ........................... 430/326 |
| 4,548,688 | 10/1985 | Matthews ....................... 204/159.18 |
| 4,565,771 | 1/1986 | Lynch et al. ......................... 430/307 |

OTHER PUBLICATIONS

Kaplan et al, "Photoresist Hardening Techniques . . . ", IBM Tech. Discl. Bulletin, vol. 21(8), Jan. 1979, p. 3205.
Chiu et al, IBM Technical Disclosure Bulletin, vol. 20, No. 7, Dec. 1977, p. 2706.
Economy et al, ibid, vol. 20, No. 8, Jan. 1978, p. 3298.
Canavello et al., IBM Technical Disclosure Bulletin, vol. 22, No. 5, Oct. 1979, p. 2134.
Bohlen et al, Ibid, vol. 23, No. 8, Jan. 1981, p. 3740.
Ma, SPIE, vol. 333, Submicron Lithography, 1982, pp. 19–23.
Moreau, Microcircuit Engineering 83, pp. 321, 327, Academic Press, 1983.
Vazsonyi et al, ibid, pp. 337–342.

Primary Examiner—John E. Kittle
Assistant Examiner—José G. Dees
Attorney, Agent, or Firm—St. Onge Steward Johnston & Reens

[57] ABSTRACT

Photo resist image layers, particularly those used for high resolution geometries in microelectronic applications, are stabilized against distortion or degradation by the heat generated during subsequent etching, ion implantation processes and the like, by the application of a film of a thermally stabilizing agent prior to post-development bake of the image layer.

The process serves to achieve thermal stabilization of the photoresist image layer without significantly affecting the ease of subsequent stripping of the layer. It is particularly effective when used to thermally stabilize positive resist images derived from photoresist systems based on novolak resins.

15 Claims, No Drawings

THERMALLY STABILIZED PHOTORESIST IMAGES

BACKGROUND OF THE INVENTION

1. Field of the Invention

This invention relates to an improved process for thermally stabilizing photoresist images and is more particularly concerned with the thermal stabilization of photoresist images having high resolution geometries for use in microelectronic applications.

2. Description of the Prior Art

As technology in the semi-conductor industry advances there is an increasing need for photoresist systems which can provide high resolution images having lines which are often below 1 micron in width. Positive resist systems are gaining popularity for producing such images. Typical of such systems are those based on novolak resins, used in a solvent base with a photosensitizer such as an ester of 1-oxo-2-diazo-naphthoquinone-5-sulfonic acid. The photoresist system of this type is coated on an appropriate substrate such as a silicon wafer whose surface has been treated to form oxides, metals, nitrides, phosphides and the like. The coated substrate is covered with a mask, exposed through the mask using appropriate UV radiation (often monochromatic) and then developed using an alkaline developer. The image present on the mask is thereby reproduced on the substrate, the areas of the photoresist layer, which were exposed to radiation by passage through the transparent portions of the mask, having been rendered soluble in the alkaline developer and therefore having been removed during the developing step. The unexposed portions of the photoresist layer, corresponding to the opaque portions of the mask, remain on the substrate. The developed image layer and substrate is then exposed to a post-development bake, to cure the photoresist remaining on the substrate and enhance the adhesion thereof to the substrate, before subjecting the image and substrate to the pattern generation step. The thermal curing of the photoresist may also take place if the photoresist and substrate are subjected to a later step involving exposure to heat and, in such circumstances, a specific post-development bake may not be required. The latter comprises etching, ion implantation doping, metal deposition and the like to produce the final image (e.g. an integrated circuit) on the substrate. Thereafter, in a final step, the remaining photoresist is stripped from the substrate using appropriate solvents or other techniques known in the art.

A number of problems arise when applying such techniques to the production of high resolution images. The harsh environment, usually including elevated temperatures, created in the etching, ion implantation and like techniques employed in the pattern generation step of the process frequently causes the photoresist image to lose its integrity either by softening and flowing, edge rounding, charring, cracking and the like. This loss of integrity is reflected in loss of the desired features in the final product of the process. Further, in order to prevent attack on the photoresist leading to failure of the latter and thus attack on the underlying substrate in places which the photoresist was designed to protect, it is frequently the practice to employ thicknesses of photoresist layer which are high in relation to the line widths in the image. Ratios of photoresist thickness to line widths as high as 2:1 have been employed. This is commonly referred to in the art as the use of a high aspect ratio image. As will be apparent to one skilled in the art, the use of such high aspect ratios is wasteful of relatively expensive photoresist system and contributes significantly to the cost of the overall process.

It is accordingly desirable to be able to produce high resolution photoresist images which are also capable of surviving exposure to the high temperatures involved in the post-imaging processes without losing their integrity. A number of attempts to achieve such photoresist images have been reported. Illustratively, Ma U.S. Pat. No. 4,187,331 teaches the heat stabilization of a resist image layer by subjecting the latter to an electrodeless flow discharge under low pressure in an atmosphere containing an organic fluorine compound such as carbon tetrafluoride.

Verelst et al. U.S. Pat. No. 3,652,274 describes the preparation of a metal printing plate in which a photoresist image is produced on the metal substrate and the image is developed using a hydrophobizing agent in the development fluid in order to increase the resistance of the image to the etching fluid used in the subsequent step. The hydrophobizing agent can be a fluoroalkyl-substituted organic silane.

Tada et al. U.S. Pat. No. 4,454,222 teaches the preparation of high resolution photoresist images using as the photoresist resin a polymer derived from trifluoroethyl-2-chloroacrylate and employing certain ketones as developers for the exposed image.

Matthews U.S. Pat. No. 4,548,688 describes hardening the photoresist by exposure to UV radiation. This method can cause difficulty in subsequent stripping of the photoresist as well as introducing an additional equipment handling step in the overall process of producing the final product.

Chin et al. U.S. Pat. No. 4,125,650 describes hardening photoresist images by chemically bonding a layer of a quinone-diazide hardening agent to the image. Cratering of the unexposed photoresist in positive photoresist images is said to occur due to gas evolved by the diazo compound during the baking step of the process. The coated image is also rendered more difficult to remove from the substrate after pattern generation has been completed.

It has now been found that high resolution photoresist images which are stabilized against distortion and other forms of thermal degradation during post-imaging treatments of the attached substrate, can be produced by a novel process which will be described hereinafter.

SUMMARY OF THE INVENTION

It is an object of the invention to provide high resolution photoresist images which will withstand exposure to elevated temperatures up to about 220° C. during post-imaging processes without suffering significant distortion or other deterioration of the image profile.

It is a further object of the invention to provide a simple, relatively inexpensive, process for treating a high resolution photoresist image after development and preferably prior to post-development bake whereby the image is stabilized against distortion or other forms of degradation in subsequent post-imaging processes.

It is yet another object of the invention to provide a process for thermally stabilizing a high resolution photoresist image on a substrate without significantly affecting the ease of subsequently stripping said photoresist from the substrate.

These objects, and other objects which will become apparent from the description which follows, are achieved by the process of the invention which, in its broadest aspect, comprises a process for thermally stabilizing a photoresist image layer formed on a substrate wherein the image layer, prior to being subjected to a post-development bake, is coated with a protective film of a material which, as discussed in detail below, bonds to the photoresist but is readily rinsed from the exposed substrate after post bake and which does not interfere with the desired operation of any of the subsequent steps of pattern generation including final removal of the photoresist image.

The process of the invention can be utilized to thermally stabilize any type of photoresist image supported by a substrate. It is particularly advantageous when utilized to treat high resolution positive photoresist images supported on substrates such as silicon, silicon oxide, metals, nitrides, phosphides and the like. In a particularly preferred embodiment of the process of the invention the latter is employed to thermally stabilize a high resolution positive photoresist image which has been prepared using a photoresist system based on a novolak resin.

The invention also comprises high resolution photoresist images supported on substrates which images have been stabilized against distortion and other degradation which would otherwise be caused by the image during post-development processing of the substrate.

DETAILED DESCRIPTION OF THE INVENTION

As set forth above, the process of the invention can be employed to thermally stabilize any photoresist image formed on a substrate. The formation of the image on the substrate can be carried out by any of the procedures well known and conventionally used in the art. Similarly, the steps to which the image and supporting substrate are subjected, after the process of the invention has been carried out on the image, can be any of those well-known and practiced in the art. Illustrative of the steps involved in the preparation of a high (often submicron) resolution positive resist image, and its processing by plasma etching to produce geometries which can be sub-micron on silicon wafers and like substrates, are those described by Grunwald et al. in a paper presented at the SPIE Conference on Microlithography, Santa Clara, Calif., March 1984.

The process of the invention is interposed as a novel step in these known and conventionally used processes after the photoresist image has been developed on the substrate but preferably prior to the post-development baking step. The novel process step of the invention comprises applying a coating of a protective film of thermally stabilizing material to the surface of the photoresist image.

The thermally stabilizing material can be any of a wide variety of materials which meet certain parameters. Thus the material is capable of being applied in solution or as a dispersion in an appropriate medium to form a thin film by coating using spin coating and the like techniques conventionally employed in the art. Secondly, the material bonds sufficiently to the surface of the photoresist image during the heating process so that, after post baking excess material can be rinsed using appropriate solvents from other portions of the coated substrate without removing any significant amount of the material on the photoresist image. Thirdly, the material is such that it does not interfere with any of the subsequent steps, i.e. the steps of pattern generation and photoresist removal to which the treated image is to be subjected. Finally the material when applied as a coating to the photoresist image serves to stabilize the latter to exposure to temperatures of at least about 150° C. and preferably to temperatures at least as high as about 175° C. Illustrative of materials which meet the above criteria and which can be employed in the process of the invention are fluorocarbon surfactants, hydroxyl group containing polymers such as polyvinylalcohol and the like, chromium trioxide, chromium sulfate, trichloroacetic acid, chromotropic acid (4,5-dihydroxy-2,7-naphthalene-disulfonic acid) and salts thereof such as the di-alkali metal salts, and the like. Other materials which meet the above parameters will be apparent to one skilled in the art.

Advantageiously the thermally stabilizing material is employed as a solution in water or in water-miscible solvents such as ethanol, isopropanol, and the like lower aliphatic alcohols, and is applied by any appropriate coating technique such as dip-coating, roller coating, spray coating, spin coating and the like. Spin-coating is a particularly preferred technique in the processing of wafers.

The application of the solution of the above material is carried out advantageously at ambient temperature but elevated temperatures, i.e. temperatures up to about 120° C. can be employed if desired, provided such temperatures have no adverse effect on the photoresist. The concentration of the thermally stabilizing material employed in the coating solution can vary over a wide range from aboout 0.1 to about 25 percent by weight. Preferably the material is employed in a concentration of about 5 to about 20 percent by weight and, most preferably, in a range of about 17 to about 19 percent by weight.

The amount of thermally stabilizing material which is applied to the surface of the photoresist image in the above manner is not critical provided that the amount is not so large as to alter significantly the geometry and profile of the image being coated. The spin-coating method of application is particularly advantageous because it leaves only a thin film on the image and any excess is spun-off.

After the coating has been applied in the above manner the coated image and supporting substrate is then subjected to the post-development bake normally employed in the conventional processes of the art discussed above. This bake step is advantageously carried out at a temperature in the range of about 100° C. to about 190° C. or higher provided that the particular temperature chosen in any given instance is such that no significant change of profile or critical dimensions (CDS) of the photoresist image is produced during the baking step. The time for which the baking is continued is not critical and is generally of the order of about 10 minutes to about 30 minutes. The time of baking employed in any given instance is dependent on the bake temperature employed and on the nature of the particular photoresist and protective coating employed. The most appropriate baking time for any given combination of reactants and bake temperatures can be readily determined by a process of trial and error. The baking step is accomplished using equipment such as a convection oven conventionally employed in the art for this particular operation.

After the baking step the image and substrate is rinsed using water or appropriate water-miscible solvents, to remove material from areas other than the photoresist image but leaving the photoimage itself coating with a protective layer of the material.

The perfluorocarbon surfactants which are employed as one of the thermally stabilizing materials in the novel process of the invention are a class of compounds well-known and recognized in the art. Thus, this class of compounds is characterized by the presence of a perfluoroalkyl group $CF_3$—$(CF_2)$—$_n$ united directly or through a polymethylene group —$(CH_2)$—$_m$ to a hydrophilic group such as a carboxylic, sulfonic or phosphonic acid group, either in the form of the free acid or a salt or ester thereof, a polyether moiety such as R—$(CH_2CH_2$—$O$—$)_xH$ wherein R is hydrogen or methyl, x has a value of about 8 to about 20, and quaternary ammonium groups.

Illustrative of perfluorocarbon surfactants are:
(i) perfluorocarbon-carboxylic acids of the general formula

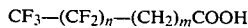

$CF_3$—$(CF_2)_n$—$(CH_2)_m$COOH wherein n has a value of about 6 to about 16 and m has a value of 0 to about 8, and the alkali metal, ammonium and tertiary amine salts of the above acids;
(ii) perfluorocarbon-sulfonic acids of the general formula

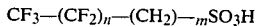

$CF_3$—$(CF_2)_n$—$(CH_2)$—$_mSO_3H$ wherein n and m have the values set forth above, and the alkali metal, ammonium and tertiary amine salts of the above acids;
(iii) perfluorocarbon-phosphonic acids of the general formula

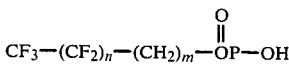

$$CF_3-(CF_2)_n-(CH_2)_m-\overset{\overset{O}{\|}}{O}P-OH$$

wherein n and m have the values set forth above, and the alkali metal, ammonium and tertiary amine salts of the above acids;
(iv) O-perfluoroalkyl polyethylene glycols of the general formula

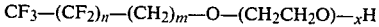

$CF_3$—$(CF_2)_n$—$(CH_2)_m$—$O$—$(CH_2CH_2O)$—$_xH$ wherein n, m and x have the values set forth above; and
(v) quaternary ammonium salts of N-perfluoroalkyl-N',N"-dialkylamine of the general formula

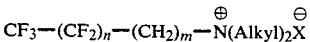

$CF_3$—$(CF_2)_n$—$(CH_2)_m$—$\overset{\oplus}{N}(Alkyl)_2\overset{\ominus}{X}$ wherein X is a cation derived from an organic acid such as acetic, propionic and the like or inorganic acid such as hydrochloric, hydriodic, hydrobromic and the like, and n and m have the values set forth above;

Mixtures of two or more different perfluorocarbon surfactants can be employed if desired provided that the combined amount of the surfactants in the mixture, which is employed in the coating solution used in the process of the invention, llies within the ranges set forth above.

While all the above types of perfluorocarbon surfactant have some solubility in water or in a mixture of water and a lower aliphatic alcohol such as methanol, ethanol, isopropyl alcohol, and the like, the solubility can be enhanced, if desired or if necessary, by employing a non-fluorine-containing surfactant in combination with the perfluorocarbon surfactant. Any of the surfactants, anionic, cationic or non-ionic, known in the art can be employed for this purpose.

Illustrative of the perfluorocarbon surfactants which can be employed in the process of the invention are those which are available from E. I. duPont under the trademark ZONYL and those available from 3M Company under the trademark FLUORAD.

The exact mechanism, by which the treatment of the photoresist image with the thermally stabilizing coating material serves to impart thermal stability to the said image, is not clearly understood at this time. However, it is believed that, in the case of the perfluorocarbon surfactant, these may enter into reaction with the resin of the photoresist by cross-linking and or may facilitate the formation of additional cross-links within the resin itself. The latter, at the time of development of the image, is only partially cross-linked and a large number of potential sites for additional cross-linking are present. The perfluorocarbon surfactants are strongly adsorbed on the surface of the image when applied thereto and possibly are capable of penetrating the sub-microscopic reticular network of cracks in the photoresist thereby approaching more closely to potential cross-linking sites. It is to be understood, however, that the above theory is offered by way of explanation only and is not to be construed as limiting the scope of the present invention in any manner whatsoever.

The process of the invention serves to impart, to the photoresist image which has been treated, the capability of resisting flow when exposed to temperatures as high as about 220° C. Accordingly, the image so treated is capable of withstanding the temperatures to which it is to be subjected in further processing of the substrate and image supported thereon whether this be by chemical etching or plasma etching and the like, with no significant loss of integrity of the resist image profile. Further, the process of the invention does not interfere with the ease with which the photoresist can be stripped from the substrate when the final step of the overall process is reached. The process of the invention is readily carried out in standard equipment, which same equipment is used in other steps of the overall process of forming and end-processing the photoresist image on the substrate.

While the process of the invention can be used to thermally stabilize any photoresist image supported on a substrate is of a particular advantage when utilized in the production and processing of high resolution images required in the production of submicron circuitry and the like. The process of the invention will be further illustrated below by reference to its use in treating positive photoresist images but it is to be clearly understood that it is not limited to treatment of such images and can be employed with any photoresist images.

The following examples illustrate the process of the invention and the best mode known to the inventors of carrying out the same but are not to be construed as limiting.

EXAMPLE 1

A silicon wafer with an oxide coating was spun-coated at 5000 rpm with a high resolution, high contrast, high aspect ratio positive photoresist system comprising a solvent blend solution of a novolak resin and a trihydroxybenzophenone ester of 2-diazo-1-oxo-naphthoquinone-5-sulfonic acid [ULTRAMAC$_{tm}$ PR 914; MacDermid Inc., Waterbury, CT]. The resulting coating had an average thickness of 1.2 microns. The coated wafer was baked at 100° C. for 30 minutes in a convection oven to evaporate the solvents from the coating before being exposed through a submicron geometry mask to UV light in a broad band contact exposure mode using an Oriel printer. The exposed photoresist was developed using an alkaline developer [ULTRAMAC MF-28: MacDermid, Inc.] to give an image of high resolution with walls approaching 90 degrees. The wafer with image attached was rinsed with water, mounted in a vacuum chuck and flooded with an aqueous solution obtained by diluting 3 parts by weight of FLUORAD ® FC-99 [believed to be a 25% w/w aqueous solution of an amine salt of perfluoroalkylsulfonic acid; 3M Company] with 1 part by weight of water. The wafer was then spun at 6000 rpm for 20 seconds leaving a thin film of the perfluoroalkylsulfonate surfactant on the photoresist image. The film dried during the spinning operation. The wafer and image was then baked at 160° C. for 30 minutes in a convection oven and then rinsed with water. Inspection of the resulting image using a scanning electron microscope showed no significant distortion or other loss of integrity of the walls of the image.

The above procedure was repeated exactly as described except that the step of coating the developed image with the perfluoroalkylsulfonate surfactant was omitted. It was found that edge rounding of the resulting image was observed when temperatures as low as 120° C. were reached in the final baking step. At higher temperatures than 120° C. more significant distortion was observed.

EXAMPLE 2

A series of positive photoresist high resolution images on silicon wafers was prepared using the procedure described in Example 1 but varying the concentration of perfluoroalkylsulfonate surfactant (FLUORAD FC-99 used in all runs), the nature of the photoresist, the spin time (20 seconds in all cases) in spin coating of the image, and the temperature of baking. The various parameters are summarized in TABLE 1 below. The images produced in all the runs were inspected using a scanning electron microscope and were found to have suffered no significant distortion or other loss of integrity of the walls of the image during the exposure to the baking temperature. In the case of Run 2K the photoresist, after the baking step, was stripped without difficulty using a proprietary resist stripper (S41; MacDermid, Inc.) at 100° C. in 2.5 minutes.

TABLE 1

| Run No. | Conc$^n$ of FC-99 (% solids) | Photo-resist | Spin RPM | Bake Temp. °C. |
|---|---|---|---|---|
| 2A | 12.5 | PR 914 | 1000 | 150 |
| 2B | 12.5 | PR 914 | 2500 | 150 |
| 2C | 18.75 | PR 914 | 6000 | 160 |
| 2D | 25 | PR 914 | 1000 | 150 |
| 2E | 25 | PR 914 | 5000 | 150 |
| 2F | 25 | PR 914 | 6000 | 150 |
| 2G | 18.75 | AZ 4110[1] | 6000 | 150 |
| 2H | 18.75 | HPR 204[2] | 6000 | 150 |
| 2I | 18.75 | PR 64[3] | 6000 | 150 |
| 2J | 18.75 | EPA 914[4] | 6000 | 150 |
| 2K | 12.5 | PR 914 | 6000 | 175 |

[1]Novolak resin based positive resist: Shipley Company, Inc.
[2]Novolak resin based positive resist: Hunt Chemical
[3]Novolak resin based positive resist: MacDermid Inc.
[4]Novolak resin based positive resist: MacDermid Inc. Run No. 2K was repeated without carrying out the coating with FC-99. Post baking at 175° C. caused marked flow of the image and rendered the latter difficult to strip from the substrate.

EXAMPLE 3

The process of Example 1 was repeated exactly as described except that the fluorocarbon surfactant there used was replaced by a 0.5% w/w aqueous solution of FLUORAD FC98 (potassium perfluoroalkylsulfonate; 3M Company) and the spin coating of the image with this surfactant was carried out for 20 seconds at 6000 rpm. The resulting image was found to have undergone no edge rounding or flow during the baking process (150° C. for 30 minutes).

EXAMPLE 4

The process of Example 3 was repeated but replacing the FLUORAD FC98 solution by a 0.1% w/w aqueous solution of FLUORAD FC95 (potassium perfluoroalkylsulfonates: 3M Company). Again it was found that the so treated image suffered no edge rounding or flow during the baking process at 150° C. for 30 minutes.

EXAMPLE 5

The process of Example 3 was repeated but replacing the FLUORAD FC98 solution by a 25% by weight solids solution of FLUORAD FC93 (ammonium perfluoroalkylsulfonates; 3M Company) in an isopropyl alochol-water solution (27% by weight isopropyl alcohol). Again it was found that the so treated image suffered no edge rounding or flow during the baking process at 150° C. for 30 minutes.

EXAMPLE 6

The process of Example 1 was repeated except that the FC surfactant was replaced by a solution of ZONYL FSA (DuPont), believed to be the lithium salt of a mixed fluorocarbon-hydrocarbon carboxylic acid (50% (wt) in a mixture of water and isopropyl alcohol), spin-coated at 5000 RPM. After a post bake of 150° C. for 30 minutes, there was no image flow (but line edges were somewhat irregular).

EXAMPLE 7

The process of Example 1 was repeated except that the FC surfactant was replaced by a solution of polyvinyl alcohol (5% by wt. in water), spin-coated at 5000 RPM. After a post bake at 140° C. for 30 minutes a slight edge rounding was seen whereas in Example 1 (second portion, without FC), edge-rounding was noted at 120° C.

EXAMPLE 8

The process of Example 1 was repeated except that the FC surfactant was replaced by a solution of 10% by wt. chromium trioxide in water, spin-coated at 1000

RPM for 20 seconds. After a post bake at 140° C. for 30 minutes, some partial edge-rounding was visible.

EXAMPLE 9

The process of Example 1 was repeated except that the FC surfactant was replaced by a solution of chromotropic acid, (disodium salt), 10% wt. in water, spin-coated at 1000 RPM for 20 seconds. After a 140° C. post bake for 30 minutes, some partial edge-rounding was noted.

EXAMPLE 10

Plasma Treatment ($SiO_2$)

The process of Example 1 was repeated and after treatment with the thermal stabilizing solution, the wafer was post baked at 140° C. for 30 minutes and exposed to plasma treatment under the following conditions:

Plasma Chamber:
 DRYTEK Model 202.
Gas Mixture:
 $C_2F_6$ at 150 SCCM,
 $CHF_3$ at 3 SCCM, and
 CO at 104 CCM.
Pressure:
 751 millitorr.
RF Power:
 1500 Watts.
Temperature at Wafer:
 25° C.
Time:
 4 minutes.

The resist thickness loss was 11%, with clean and sharp edge definition. There was no surface pitting on the resist nor any changes in the critical dimensions.

A control wafer without the thermal stabilizing treatment showed significant edge rounding after the post-bake and before plasma treatment. After plasma, the pattern was transferred through the oxide leaving somewhat rounded edges and changes in the critical dimensions.

EXAMPLE 11

Plasma Treatment (Al)

The process of Example 1 was repeated on a wafer of aluminum alloy (96% Al, 4% Cu). After treatment with the thermal stabilizing solution, the wafer was post baked at 125° C. for 30 minutes and subjected to plasma treatment.
Plasma Chamber:
 DRYTEK Model 203.
Gas Mixture:
 $BCl_3$ at 302 SCCM,
 $C_{l2}$ at 18 SCCM.
Pressure:
 124 millitorr.
RF Power:
 1300 Watts.
Temperature at Wafer:
 35° C.
Time:
 4 minutes, followed by anti-corrosion treatment of 30 seconds in $SF_6$ at 100 SCCM, 125 millitorr and 450 Watts. RF.

The etched surface showed straight edges with no rounding or apparent critical dimension change. The resist thickness loss was 20%.

A control wafer without the thermal stabilizer treatment showed a 40% loss in resist thickness. There was edge rounding after the post bake which was transferred to the image.

The difference in the resist thickness losses over the aluminum substrate versus the silicon dioxide (see Example 10) is caused by the difference in plasma gases used.

What is claimed is:

1. A process for thermally stabilizing a photoresist image layer formed on a substrate, said process comprising coating said image layer with a protective film of a thermally stabilizing material in solution in water or water-miscible solvent prior to subjecting said image layer to a post-development bake, wherein said thermally stabilizing material consists essentially of a compound or a mixture of two or more compounds selected from the group consisting of chromotropic acid, perfluorocarbon carboxylic acids, perfluorocarbon-sulfonic acids, perfluorocarbon phosphonic acids, and alkali metal, ammonium and amine salts of said acids, ethoxylated perfluorocarbon alcohols, and quaternary ammonium salts of N-perfluoroalkyl-N',N''-dialkylamines.

2. A process according to claim 1 wherein said post-development bake is carried out at a temperature within the range of about 100° C. to about 190° C.

3. A process according to claim 1 wherein the thermally stabilizing material is applied as a solution to the photoresist image layer by spin coating.

4. A process according to claim 3 wherein the thermally stabilizing material is present in said solution in an amount within the range of about 0.1 to about 25 percent by weight.

5. A process according to claim 1 wherein said image layer has been produced using a positive photoresist resin.

6. A process according to claim 5 wherein said positive photoresist resin comprises a novolak resin and a sensitizer and said image layer has been developed using an alkaline developer.

7. A process for thermally stabilizing a photoresist image layer formed on a substrate, said process comprising coating said image layer with a protective film of a perfluorocarbon sulfonic acid in the form of the free acid or a salt thereof prior to subjecting said image layer to a post-development bake.

8. A process for thermally stabilizing a photoresist image layer formed on a substrate, said process comprising coating said image layer with a protective film of the disodium salt of chromotropic acid prior to subjecting said image layer to a post-development bake.

9. A process for forming a heat stabilizing positive photoresist image layer which comprises the steps of coating a substrate with a layer of a positive photoresist composition, irradiating said layer through a mask, developing the image layer so produced, coating said developed image layer with a film of a thermally stabilizing material in solution in water of a water-miscible solvent and subjecting the coated layer to a post-development bake at a temperature within the range of about 110° C. to about 170° C., wherein said thermally stabilizing material consists essentially of a compound or a mixture of two or more compounds selected from the group consisting of chromotropic acid, perfluorocarbon carboxylic acids, perfluorocarbon-sulfonic acids, perfluorocarbon phosphonic acids, and alkali metal, ammonium and amine salts of said acids; ethoxylated perfluorocarbon alcohols, and quarternary ammonium salts of N-perfluoroalkyl-N',N"-dialkylamines.

10. A process according to claim 9 wherein the thermally stabilizing material is applied to said image layer as a solution containing from about 0.1 to about 25 percent by weight of said material.

11. A process according to claim 9 wherein said positive photoresist composition comprises a solvent solution comprising a novolak resin and a photosensitizer.

12. A process according to claim 11 wherein the image layer has been developed using an alkaline developer.

13. A process according to claim 9 wherein said thermally stabilizing material is spin-coated on said image layer in the form of an aqueous solution.

14. A process for forming a heat stabilized positive photoresist image layer which comprises the steps of coating a substrate with a layer of a positive photoresist composition, irradiating said layer through a mask, developing the image layer so produced, coating said developed image with a film of a perfluoroalkyl sulfonic acid in the form of the free acid or a salt thereof in solution in water or a water-immiscible solvent and subjecting the coated layer to post-development bake at a temperature within the range of about 110° C. to about 170° C.

15. A process for forming a heat stabilized positive photoresist image layer which comprises the steps of coating a substrate with a layer of a positive photoresist composition, irradiating said layer through a mask, developing the image layer so produced, coating said developed image with a film of the disodium salt of chromotropic acid in solution in water or a water-miscible solvent and subjecting the coated layer to a post-development bake at a temperature within the range of about 110° C. to about 170° C.

* * * * *